United States Patent [19]
Wang et al.

[11] Patent Number: 6,017,808
[45] Date of Patent: Jan. 25, 2000

[54] NITROGEN IMPLANTED POLYSILICON GATE FOR MOSFET GATE OXIDE HARDENING

[75] Inventors: Shiuh-Luen Wang, San Jose; Chiang-Sheng Yao, Palo Alto; Wen-Chin Yeh, Fremont, all of Calif.

[73] Assignee: LSI Logic Corporation, Milpitas, Calif.

[21] Appl. No.: 08/957,692

[22] Filed: Oct. 24, 1997

[51] Int. Cl.$^7$ .................. H01L 21/425; H01L 21/3205
[52] U.S. Cl. .................. 438/528; 438/585; 438/592
[58] Field of Search ................... 438/528, 585, 438/592

[56] References Cited

U.S. PATENT DOCUMENTS

| | | |
|---|---|---|
| 4,697,333 | 10/1987 | Nakahara . |
| 4,914,046 | 4/1990 | Tobin et al. . |
| 5,393,676 | 2/1995 | Anjum et al. . |
| 5,464,792 | 11/1995 | Tseng et al. . |
| 5,567,638 | 10/1996 | Lin et al. . |
| 5,633,177 | 5/1997 | Anjum ................... 438/301 |
| 5,804,496 | 9/1998 | Duane ..................... 438/520 |
| 5,882,974 | 3/1999 | Gardner et al. ........... 438/286 |
| 5,885,861 | 3/1999 | Gardner et al. ........... 438/231 |

OTHER PUBLICATIONS

S. Haddad et al., Improvement of Thin–Gate Oxide Integrity Using Through–Silicon–Gate Nitrogen Ion Implantation, IEEE Electron Device Letter, vol. EDL–8, pp. 58–60, Feb. 1987.

T. Kuroi, et al., Novel NICE (Nitrogen Implantation into CMOS Gate Electrode and Source Drain) Structure for High Reliability and High Performance 0.25 μm Dual Gate CMOS, Tech. Dig. of IEDM, pp. 325–328, 1993.

S. Nakayama, et al., The Effect of Nitrogen in P+ Polysilicon Gates on Boron Penetration into Silicon Substrate through the Gate Oxide, 1996 Symposium on VLSI Technology, pp. 228–229.

A. Chou, et al., The Effects of Nitrogen Implant into Gate Electrode on the Characteristics of Dual–Gate MOSFET's with Ultra–Thin Oxide and Oxynitrides, International Reliability Physics Symposium, pp. 174–177, 1997.

*Primary Examiner*—Richard Booth
*Attorney, Agent, or Firm*—Beyer & Weaver, LLP

[57] ABSTRACT

A method for hardening of gate oxide without forming low dopant concentration regions at the gate oxide-polysilicon interface is described. Polysilicon is deposited onto gate oxide followed by nitrogen implantation and annealing. At this point nitrogen concentration peaks exist at the gate oxide interfaces with the single crystal substrate and the polysilicon gate electrode. This effectively hardens the gate oxide. A third polysilicon gate electrode exists in the bulk of the polysilicon gate electrode. In the described process the region of the polysilicon layer that contains the nitrogen concentration peak is removed. An electronically active dopant may then be implanted. Alternatively, a fresh polysilicon layer may then be deposited followed by implantation of an electronically active dopant. Thus, the method of the invention avoids retardation of electronically active dopant diffusion.

20 Claims, 8 Drawing Sheets

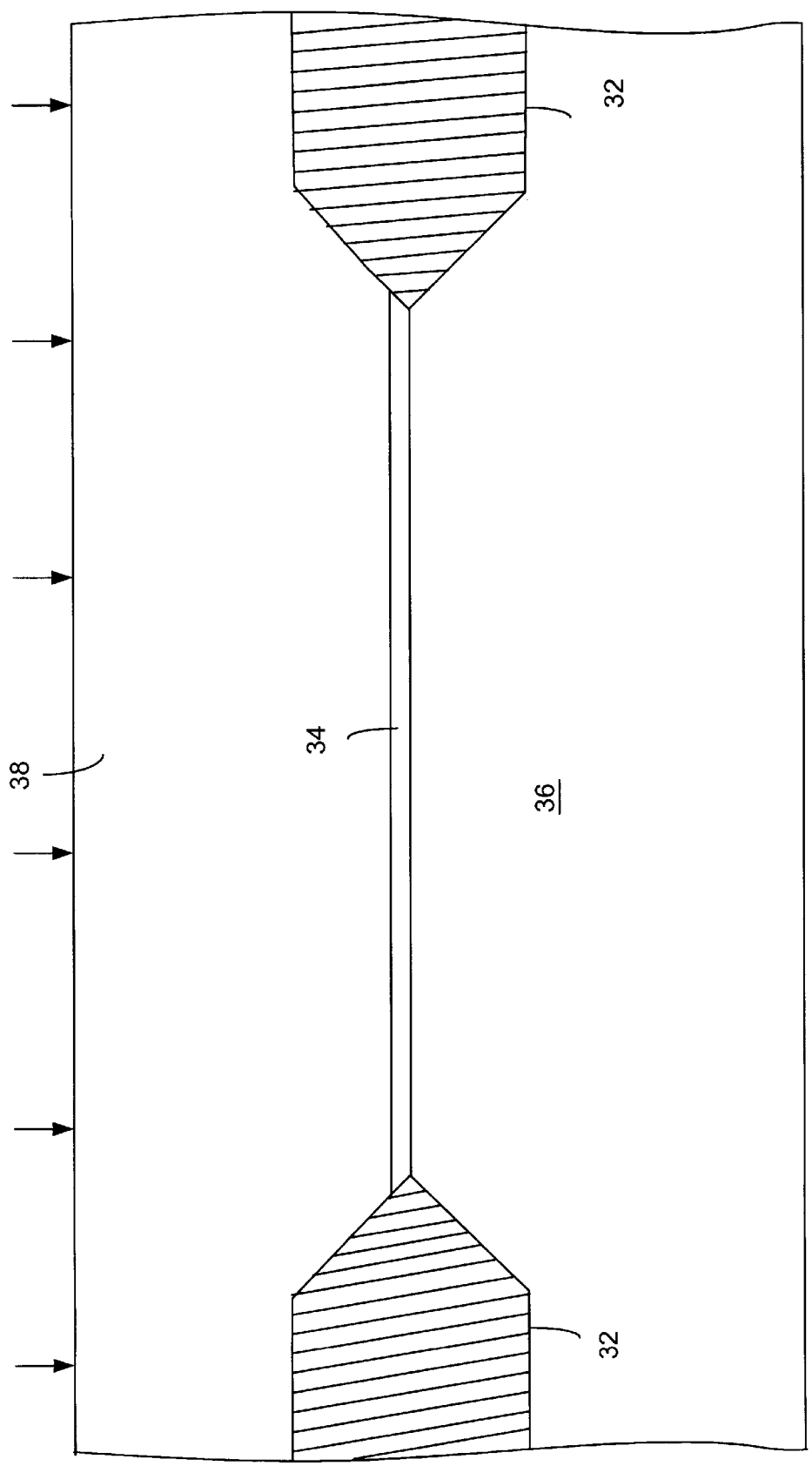

NITROGEN IMPLANTED POLYSILICON GATE FOR MOSFET GATE OXIDE HARDENING

BACKGROUND OF THE INVENTION

1. The Field of the Invention

The present invention relates to semiconductor devices and methods for their construction. More particularly, the present invention relates to hardening of gate oxides in MOS semiconductor devices by nitrogen implantation without formation of ion depletion regions in polysilicon. More specifically, the present invention provides a method for obtaining regions of substantial nitrogen concentrations at the gate oxide interface without having a corresponding area of substantial nitrogen concentration in bulk polysilicon.

2. The Background Art

Gate oxide hardening is required for at least three reasons. First, insufficiently hard gate oxides can break down at voltages below normal operating voltages. Second, hardened gate oxides resist hot electron degradation which creates dangling bonds. Finally, hardened gate oxides are especially effective in preventing boron diffusion from the polysilicon gate electrode. This is particularly important in PMOS devices where boron is commonly provided in the polysilicon and must be prevented from diffusing through the gate oxide into the silicon substrate to minimize threshold voltage fluctuation.

Hardening has gained increasing significance since the reduced size of current semiconductor devices has correspondingly compressed gate oxide thickness. Dopant diffusion from polysilicon into the silicon substrate has become an important problem because of the increasingly thin gate oxide regions found in modern semiconductor devices. For example, in some next generation devices the channel length will be about 0.18 $\mu$m and the gate oxide thickness will be about 30 Å. In future generation devices both the channel length and gate oxide thickness will continue to shrink. Thus, gate oxide hardening will be an important process in the construction of modern semiconductor devices for the foreseeable future.

Typically, hardening has been accomplished by diffusing nitrogen into gate oxide after formation. In this process, the gate oxide is thermally grown on a single crystal silicon substrate. Next, the gate oxide is exposed to an atmosphere containing nitrous oxide or nitric oxide at about 900° C. which causes silicon nitride and silicon oxynitride formation at the gate oxide-silicon substrate interface. The increased concentration of nitrogen containing species at the gate oxide-silicon substrate interface prevents boron diffusion into the silicon substrate, hot electron degradation and improves the breakdown resistance of the gate oxide.

Unfortunately, hardening through nitrogen diffusion has certain deficiencies. First, the high temperature of gate oxide hardening by nitrogen diffusion obliterates any sharp concentration profiles at the previously implanted dopant region interfaces. Furthermore, gate oxide by nitrogen diffusion hardening fails to prevent boron diffusion into the gate oxide from polysilicon although it does prevent boron diffusion from the gate oxide to the silicon substrate. The dielectric properties of the gate oxide are adversely affected by electronically active dopants such as boron.

A nitrogen implantation process in which nitrogen ions are implanted into polysilicon gate electrode cures some of the deficiencies in the nitrogen diffusion gate oxide hardening process (S. Haddad, et al., *EKE Electron Device Letter,* 8, 58–60, 1987; T. Kuroi, et al., *Tech. Dig. of IEDM*, 325–328, 1993; S. Nakayama et al., 1996 *Symposium on VLSI Technology*, 228–229; A. Chou, et al., *International Reliability Physics Symposium*, 174–177, 1997). The above-mentioned references are herein incorporated by reference.

FIG. 1 illustrates central features of a nitrogen implanted MOS device (Chou et al., 1997). Curve 2 represents the nitrogen distribution profile after implantation and shows that nitrogen is concentrated at a peak region 5 in the polysilicon. Curve 4 represents the nitrogen distribution profile after annealing and shows that nitrogen is concentrated at the silicon substrate-gate oxide interface (peak 7) and the gate oxide-polysilicon interface (peak 9). The region of significant nitrogen concentration at the gate oxide-polysilicon interface prevents boron diffusion from polysilicon into the gate oxide.

However, as can be seen in Curve 4 of FIG. 1 and is more clearly illustrated in FIG. 2 a significant nitrogen concentration peak exists in the bulk polysilicon gate electrode after annealing. Referring now to FIG. 2, Curves 12 and 14 represent the nitrogen and the boron distribution profiles respectively in the bulk polysilicon after nitrogen implantation and annealing at 850° C. Similarly, Curves 18 and 16 represent the nitrogen and the boron distribution profiles respectively in the bulk polysilicon after nitrogen implantation and annealing at 950° C.

Examination of FIG. 2 shows that the size of the nitrogen peaks 15 and 17 in bulk polysilicon inversely affects the boron concentration profile near the gate oxide interface. The left side of the graph (x=0.00) corresponds to the top of the polysilicon gate and the right side corresponds to the polysilicon-gate oxide interface as indicated by the nitrogen concentration peak. The larger the nitrogen peak in the bulk polysilicon, the lower the boron concentration in the polysilicon proximate the polysilicon-gate oxide interface.

Retardation of boron diffusion in the bulk polysilicon results in formation of polysilicon depletion regions during device operation. Polysilicon depletion regions act as non-conductive areas that effectively increase gate oxide thickness, thus degrading device performance.

In any event, it has become apparent that as device sizes shrink an improved technique for hardening gate oxides is required. Such improved techniques should harden gate oxide without forming polysilicon depletion areas at the gate oxide-polysilicon interface.

SUMMARY OF THE INVENTION

The present invention provides a method for hardening of gate oxide without forming low boron concentration regions in polysilicon at the gate oxide-polysilicon interface. This is accomplished by a process that involves depositing polysilicon onto a gate oxide followed by nitrogen implantation and annealing. Then the region of the polysilicon layer that contains areas of significant nitrogen concentration is removed. Because the nitrogen concentration peak in the bulk polysilicon has been removed the dopant concentration from a subsequent implant is sufficiently great near the gate oxide-polysilicon interface that depletion regions are not easily formed in that region during normal device operation.

In one aspect, the present invention provides a method for hardening gate oxide in a partially fabricated electronic device. First, nitrogen ions are implanted in a first polysilicon layer deposited on gate oxide. Second, an annealing step is performed that results in areas of significant nitrogen concentration at the gate oxide and at a location in the bulk polysilicon. Third, sufficient polysilicon is removed from the top of the first polysilicon layer to form a second polysilicon layer in which the region of substantial nitrogen concentration in the bulk polysilicon has been removed. Optionally, a third polysilicon layer may be deposited on the now thinned second polysilicon layer to replace the polysilicon that was removed.

Preferably, the gate oxide is not more than about 50 Å thick. In one embodiment, an electronically active dopant is implanted in the second polysilicon layer. In a more specific embodiment, the electronically active dopant is boron. In another embodiment, the electronically active dopant is phosphorus.

Preferably, the first polysilicon layer is between about 2000 Å and about 4000 Å thick. In a more specific embodiment, the second polysilicon layer is between about 750 Å and about 2500 Å thick. Preferably, the annealing step is performed at between about 800° C. and about 1000° C. More specifically, the annealing step is performed at about 900° C. In one embodiment, the partially fabricated electronic device is a partially fabricated NMOS device. In another embodiment, the partially fabricated electronic device is a partially fabricated PMOS device and boron is the preferred dopant in the gate electrode.

As mentioned, a third polysilicon layer may be deposited onto the second polysilicon layer to provide a composite polysilicon layer. No nitrogen should be subsequently implanted in this composite layer. As before, electronically active dopant will typically be implanted into the composite polysilicon layer. In a specific embodiment, the electronically active dopant is boron.

In this second aspect, the first layer may be relatively thin since the total thickness of the final polysilicon layer (the composite layer) will include some freshly grown polysilicon. In the alternative scenario, where no additional polysilicon is formed on the second layer, the first layer must be sufficiently thick that even after removal of the portion of polysilicon containing the nitrogen concentration peak, the total polysilicon thickness is great enough to serve as a gate electrode. In the second aspect the third polysilicon layer is preferably between about 1000 Å and about 2000 Å thick. Thus, the composite polysilicon layer is preferably between about 1500 Å and about 3500 Å thick.

In another aspect, the present invention provides a semiconductor device that includes a gate oxide layer deposited on a silicon substrate, a polysilicon layer deposited on the gate oxide layer, a gate oxide-polysilicon interface, a gate oxide-silicon substrate interface, a first substantial nitrogen concentration peak at the gate oxide-polysilicon interface and a second substantial nitrogen concentration peak at the gate oxide-silicon substrate interface. In this device the polysilicon layer is devoid of a substantial nitrogen concentration peak greater than about $10^{19}$ atoms/cm$^3$.

In one embodiment, the gate oxide layer is not more than about 50 Å thick. In a more preferred embodiment, the gate oxide layer is between about 20 Å and 35 Å thick.

Preferably, the first substantial nitrogen concentration peak is between about $10^{20}$ atoms/cm$^3$ and about $10^{21}$ atoms/cm$^3$. In another embodiment, the second substantial nitrogen concentration peak is between about $10^{19}$ atoms/cm$^3$ and about $10^{20}$ atoms/cm$^3$. In yet another embodiment, the nitrogen concentration in the polysilicon layer does not exceed about $10^{19}$ atoms/cm$^3$ outside the interface with the gate oxide.

In a preferred embodiment, the semiconductor device is a PMOS device. In such cases, the polysilicon layer typically includes a boron dopant. In a more specific embodiment, the boron concentration in the polysilicon layer is at least about $5 \times 10^{19}$ atoms/cm$^3$ proximate the gate oxide and polysilicon interface.

These and other features and advantages of the invention will be described below in the Detailed Description with reference to the Drawings.

BRIEF DESCRIPTION OF THE DRAWINGS

FIG. 4A shows a cross sectional view of a partially fabricated MOS device after polysilicon deposition, followed by nitrogen implantation and annealing.

DETAILED DESCRIPTION OF SPECIFIC EMBODIMENTS

Figure 1:
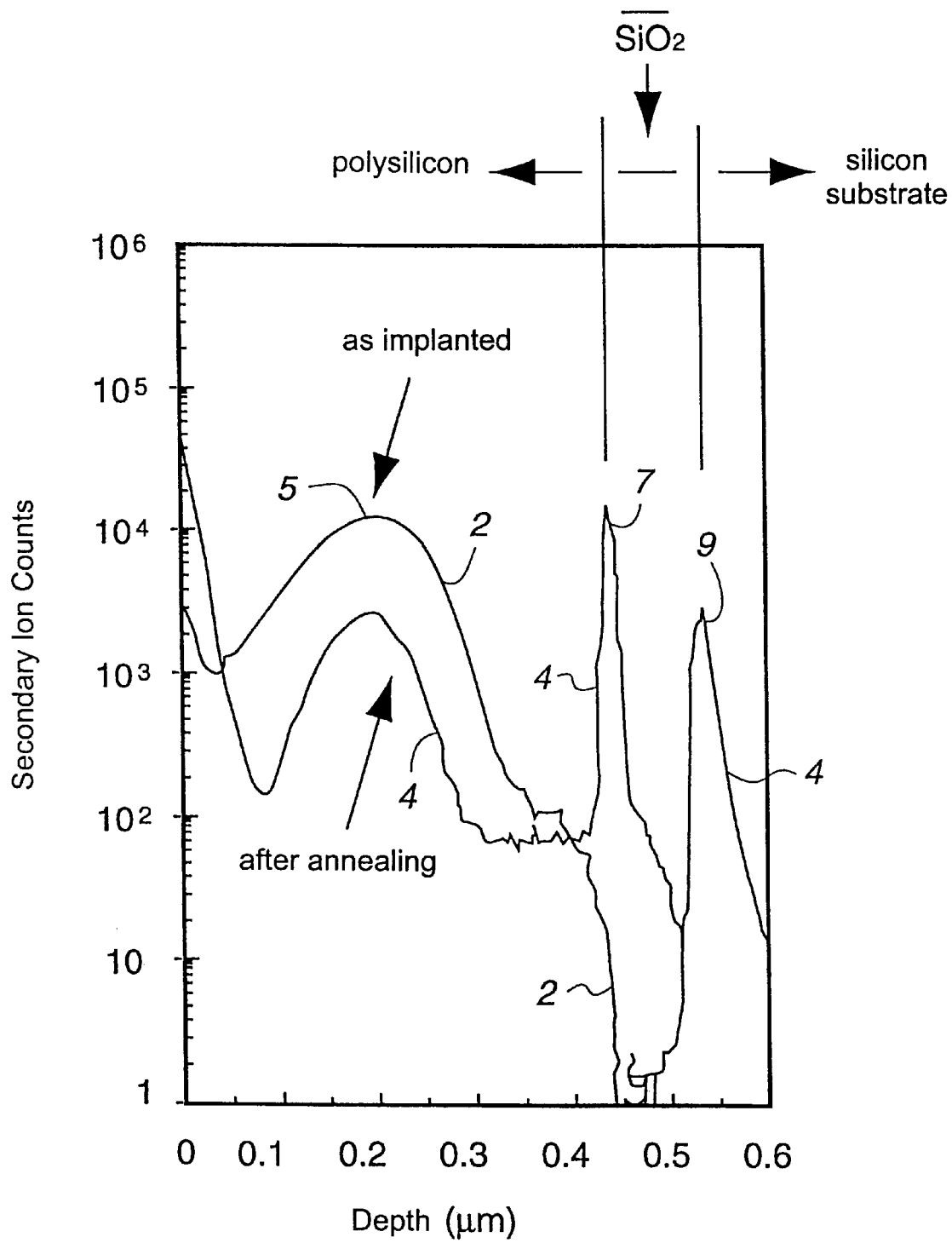
FIG. 1 is a SIMs profile illustrating nitrogen distribution in a polysilicon layer on silicon before and after annealing.
Figure 2:
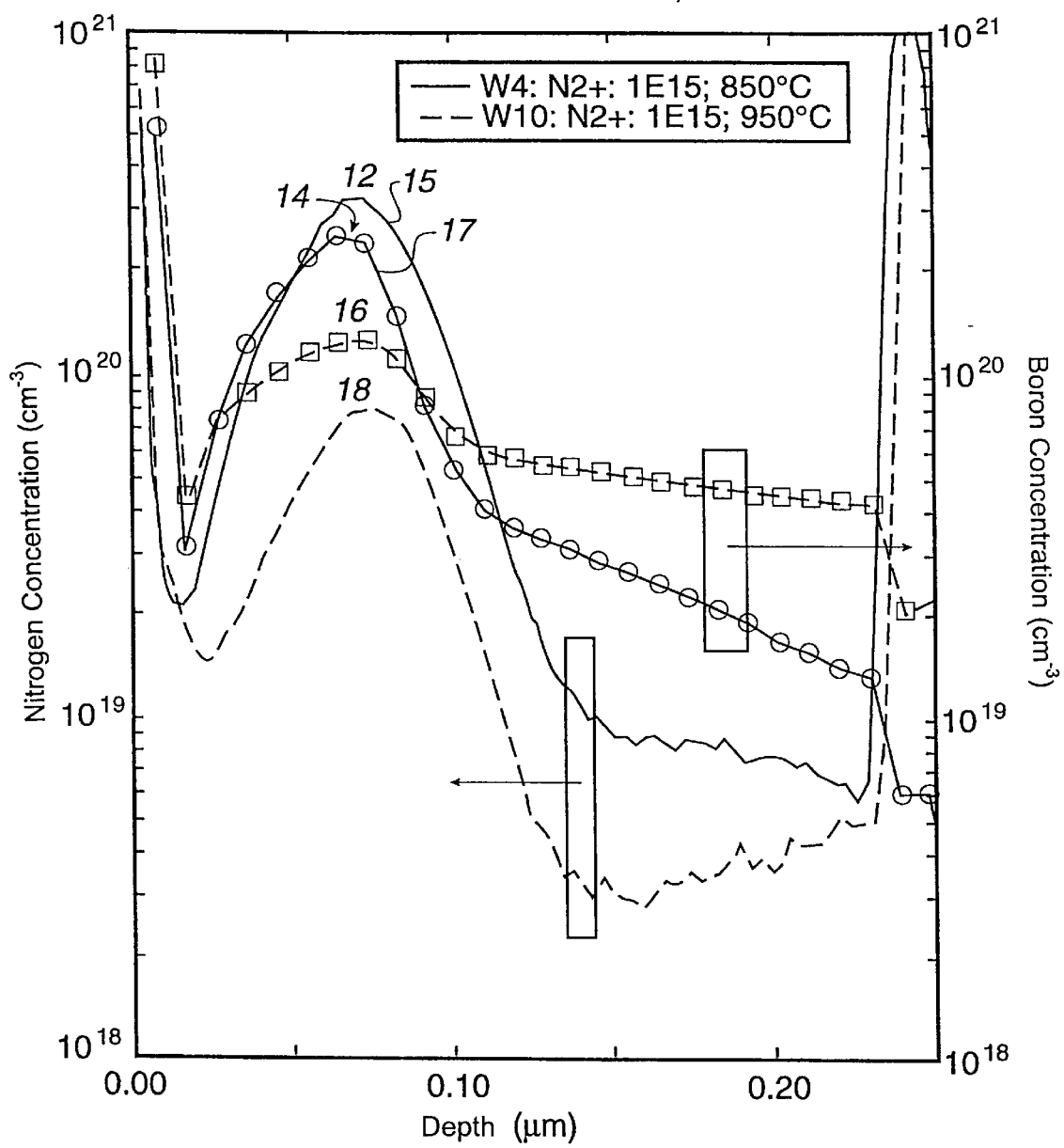
FIG. 2 is a SIMs profile showing boron and nitrogen distribution in a polysilicon layer after annealing.
Figure 3:
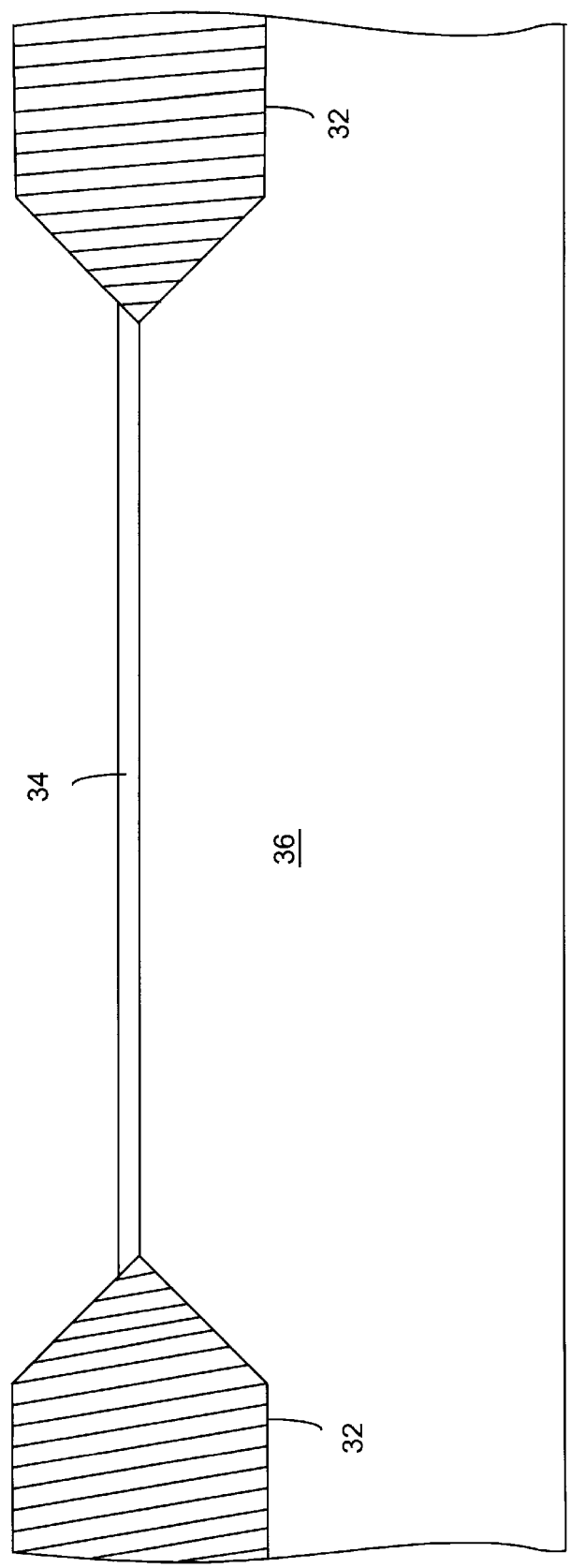
FIG. 3 shows a cross sectional view of a partially fabricated MOS device.

A specific embodiment of the invention will be described with reference to FIGS. 3, 4A, 4B, 5A, 5B, 6A, 6B and 7. FIG. 3 is a cross sectional view of a partially fabricated semiconductor device. The partially fabricated device includes a field oxide region 32 and a gate oxide layer 34 which is formed over a silicon substrate 36. The gate oxide layer 34 in modern devices is typically less than about 50 Å thick. More specifically, the gate oxide layer 34 is between about 30 Å and 40 Å in the emerging technology of 0.18 μm devices.

FIG. 4A is a cross sectional view of the partially fabricated semiconductor device of FIG. 3 after deposition of a first polysilicon layer 38 on gate oxide layer 34 followed by nitrogen implantation and annealing. Polysilicon is deposited using conventional conditions. Typically, the device is implanted with nitrogen at various dosages ranging from between about $10^{14}$ ions/cm$^2$ to about $5 \times 10^{15}$ ions/cm$^2$ (more preferably between about $5 \times 10^{14}$ ions/cm$^2$ to about $2 \times 10^{15}$ ions/cm$^2$) at energies ranging from about 40 keV to about 80 keV (preferably about 60 keV) using conventional ion implantation equipment. The freshly deposited polysilicon layer 38 is typically between about 2000 Å and about 3500 Å thick. More preferably this first polysilicon layer is between about 2500 Å and 3000 Å thick. Typically, the annealing step is performed between about 800° C. and about 1000° C. Preferably, the annealing step is performed at about 900° C.

Figure 4B:
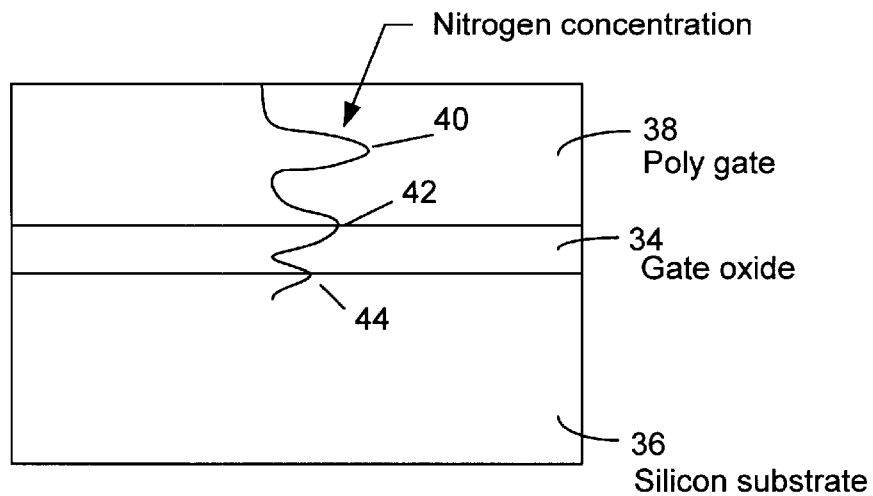
FIG. 4B illustrates areas of nitrogen concentration in a partially fabricated MOS device after polysilicon deposition, nitrogen implantation and annealing.

FIG. 4B illustrates areas of nitrogen concentration in the partially fabricated semiconductor device after nitrogen implantation and annealing to produce the structure illustrated in FIG. 4A. The approximate baseline nitrogen concentration in FIG. 4B may be about $10^{19}$ atoms/cm$^3$. Regions of significant nitrogen concentration are found at peak 40 in the bulk region of the polysilicon layer 38, at peak 42 located at the gate oxide-polysilicon interface and at peak 44 located at the gate oxide-silicon substrate interface. The relative size of peaks 40, 42 and 44 depends on the post implant anneal conditions after nitrogen implantation and are thus representative rather than absolute. Therefore, FIG. 4B should be used for a qualitative rather than a quantitative understanding of the problem.

Peaks 42 and 44 impede diffusion of electronically active dopants into the gate oxide 34 and silicon substrate 36, thus preserving desired electronic properties of the gate oxide 34 and substrate 36. However, peak 40 retards the diffusion of electronically active dopants in polysilicon layer 38 which results in depletion regions in bulk polysilicon near the gate oxide interface that severely degrade device performance as explained above.

Figure 5B:
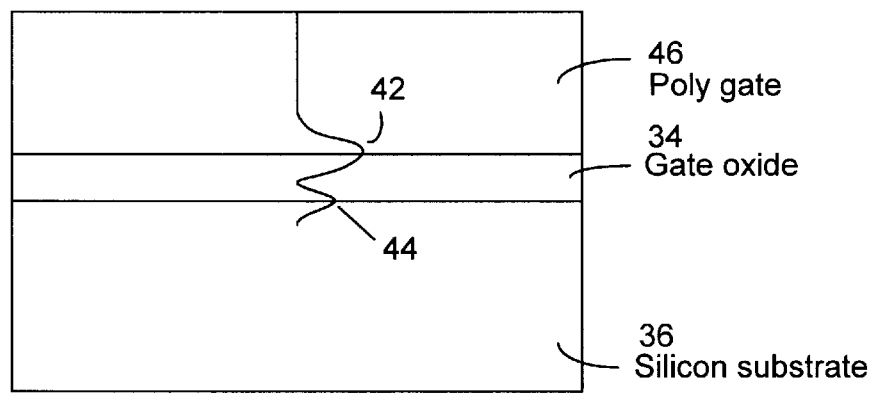
FIG. 5B illustrates areas of nitrogen concentration in a partially fabricated MOS device after removal of a top portion of the polysilicon layer.
Figure 5A:
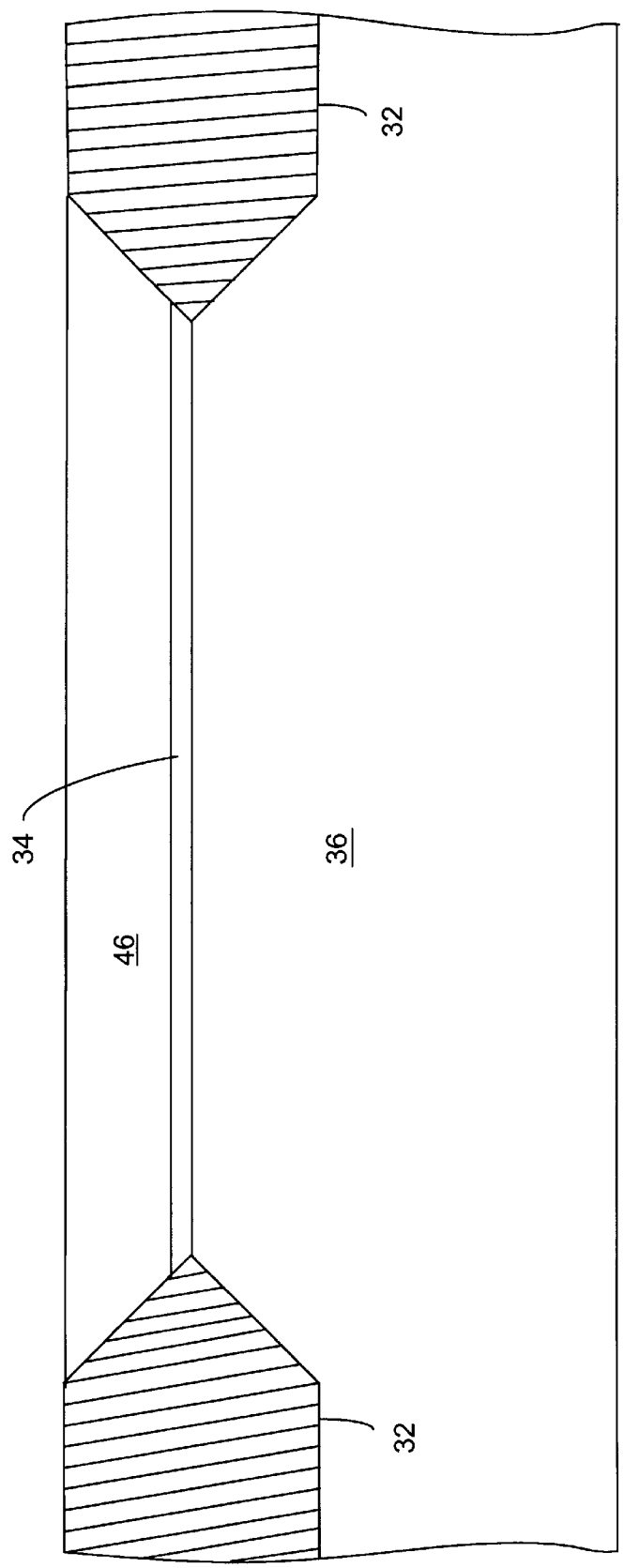
FIG. 5A is a cross sectional view of a partially fabricated MOS device after removal of a top portion of the polysilicon layer.

FIG. 5A is a cross sectional view of the partially fabricated semiconductor device of FIG. 4A after removing a top portion of polysilicon layer 38 to form polysilicon layer 46. The top portion of polysilicon layer 38 can be removed by chemical mechanical polishing (CMP), dry etch, wet etch and other commonly known methods. Between about 1000 Å and about 1300 Å of polysilicon are typically removed in this process to generate a second polysilicon layer 46 which is between about 750 Å and about 2500 Å thick.

FIG. 5B illustrates areas of nitrogen concentration in the partially fabricated semiconductor device after removal of a top portion of the polysilicon layer. Regions of significant nitrogen concentration are found at peaks 42 and 44 located at the gate oxide interfaces. Significantly, polysilicon layer 46 contains no region of significant nitrogen concentration. Thus, the portion of polysilicon layer 38 in FIG. 4A that contained peak 40, an area of significant nitrogen concentration, has been removed.

Figure 6B:
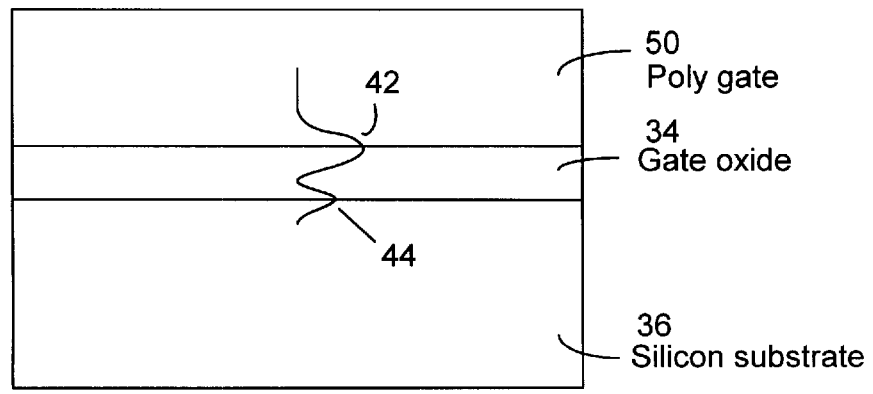
FIG. 6B illustrates areas of nitrogen concentration in a partially fabricated MOS device after deposition of a third polysilicon layer on a second polysilicon layer to provide a composite polysilicon layer.
Figure 6A:
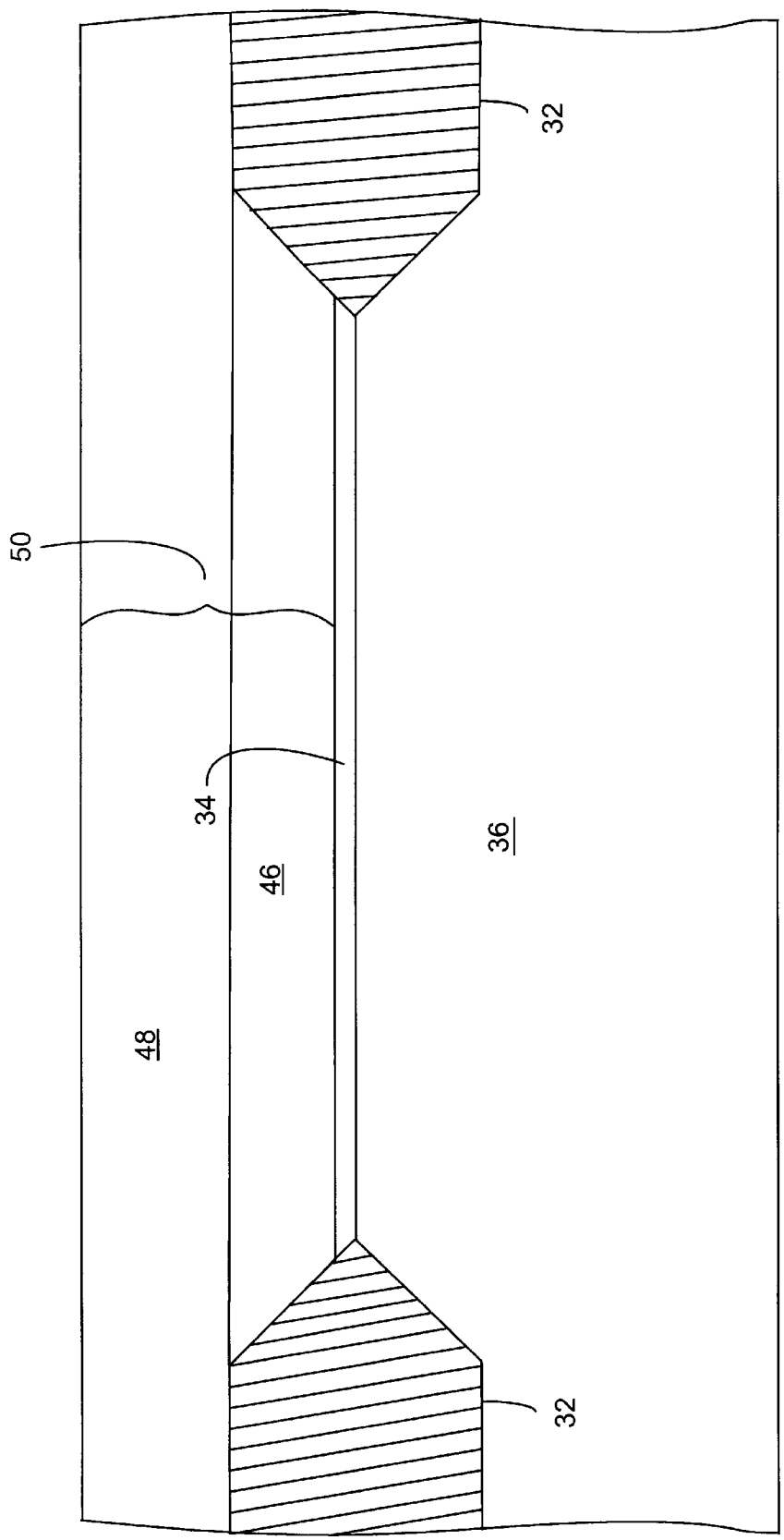
FIG. 6A is a cross sectional view of a partially fabricated MOS device after a third polysilicon layer is deposited on a second polysilicon layer to provide a composite polysilicon layer.

FIG. 6A is a cross sectional view of the partially fabricated semiconductor device of FIG. 5A after a third polysilicon layer 48 is deposited on the second polysilicon layer 46 to provide composite polysilicon layer 50. The third polysilicon layer 48 is preferably between about 1000 Å and about 2000 Å thick depending on the thickness of the first and second layers. The composite polysilicon layer 50 is preferably between about 1500 Å and about 3500 Å thick.

FIG. 6B illustrates nitrogen concentration in the partially fabricated semiconductor device after deposition of the third polysilicon layer 48. Significant areas of nitrogen concentration exist at peaks 42 and 44 located at the gate oxide interfaces. Composite polysilicon layer 50 lacks an area of significant nitrogen concentration and in particular the third polysilicon layer 48 has essentially no elevated concentration of nitrogen since it has not been exposed to a nitrogen implant.

Generally, an electronically active dopant such as boron or phosphorus is implanted in polysilicon layer 50. Polysilicon layer 50 contains no area of significant nitrogen concentration that hinders dopant diffusion. Thus, depletion regions that degrade device performance are not formed in polysilicon layer 50 during normal MOS operation.

Figure 7:
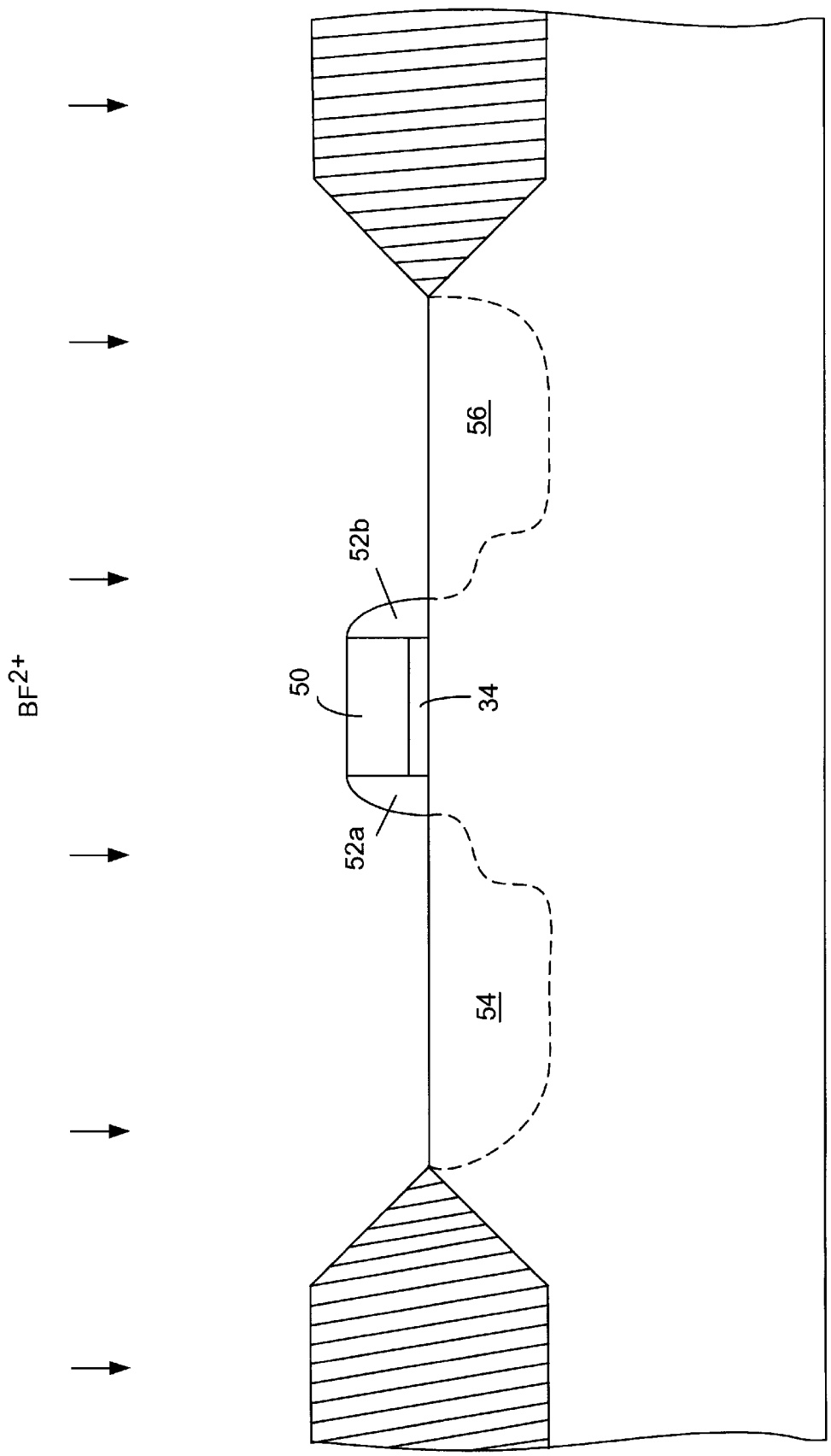
FIG. 7 is a cross sectional view of a partially fabricated MOS device after etching of the polysilicon layer and gate oxide layer followed by boron implantation.

FIG. 7 is a cross sectional view of the partially fabricated semiconductor device after etching followed by boron implantation. Boron implantation is typically done with $BF_2^+$ at between about $1\times10^{15}$ ions/cm$^2$ and about $5\times10^{15}$ ions/cm$^2$ (more preferably between about $3\times10^{15}$ ions/cm$^2$ and about $5\times10^{15}$ ions/cm$^2$) at energies ranging from between about 25 keV and about 50 keV (more preferably at about 40 keV). Polysilicon gate electrode 50 and gate oxide 34 are straddled by spacers 52a and 52b. Boron implantation to form incipient source 54 and drain 56 also affects the polysilicon gate electrode. Here, because regions of nitrogen concentration do not exist in the polysilicon layer 50 the boron concentration in the gate electrode has improved uniformity (in comparison to prior art nitrogen implanted devices) after implantation. Thus, depletion regions that degrade performance are not formed in a device made using the method of the instant invention.

The boron in composite gate electrode may be implanted during the formation of source region 54 and drain region 56. In some cases, the source and drain regions will be formed in a single implant step. In many conventional fabrication schemes (and as illustrated in FIG. 7), however, they will be formed in two steps. In such processes, a Lightly Doped Drain (LDD) implant is performed initially. This will form p-type source/drain tip regions extending under gate oxide 34 as shown in FIG. 7. Source/drain regions 54 and 56 are completed after forming spacers 52a and 52b adjacent gate electrode 50. The spacers may be formed by depositing a blanket layer of oxide on the wafer surface and then performing an anisotropic etch. After the spacers have been formed, a second p-type implant is performed to form heavily doped portions of source/drain regions 54 and 56 extending beyond the spacers as shown. The polysilicon gate electrode 50 may be exposed to one or both of these implants depending upon how much dopant is needed in the gate.

In an alternative embodiment, deposition of the third polysilicon layer 48 onto the second polysilicon layer 46 to form the composite polysilicon layer 50 illustrated in FIG. 5 can be omitted. Thereafter, an electronically active dopant such as boron or phosphorus is implanted directly in second polysilicon layer 46. No regions of significant nitrogen concentration exist in polysilicon layer 46 that would hinder electronically active dopant diffusion. Thus, depletion regions that degrade device performance are not formed in polysilicon layer 46. In this embodiment, the second polysilicon layer 46 can be processed directly, by eliminating a process step, to yield the partially fabricated semiconductor device illustrated in FIG. 7.

Note that in this alternative embodiment, first layer 38 must be deposited to a thickness that allows nitrogen concentration peak 40 to reside above the height of the final polysilicon gate electrode. Thus, after the first layer is etched or planarized to remove peak 40 no additional polysilicon need be deposited to reach the necessary gate thickness. On the other hand layer 38 should not be so thick that implanted nitrogen has difficulty reaching and hardening the gate oxide. In a preferred version of this embodiment layer 38 is formed at a thickness of between about 2500 Å and about 5000 Å, more preferably between about 3000 Å and about 4000 Å and most preferably between about 3000 Å and about 3500 Å.

After the source/drain regions have been formed as shown in FIG. 7, the device may be completed as follows. It should be understood that these steps are not critical to the invention and may be substituted with other suitable process steps known in the art. First, a silicide (not shown) may formed on top of the polysilicon and substrate to create less resistive regions. Then a passivation layer of, e.g., borophosphosilicate glass ("BPSG") is deposited over the entire structure. This is sometimes referred to as an inter-layer dielectric or ILD. At this point, the front end processing is complete.

Typical back end process steps will now be described. Initially, a contact mask is formed on the ILD to define contacts to device elements on the substrate and to the associated polysilicon gate electrodes. Thereafter, the ILD is etched (typically by a plasma etch) to form vertical contact holes through the passivation layer to level 1 (the underlying substrate and polysilicon). At this point, a diffusion barrier layer (sometimes referred to as a "glue" layer) of a material such as titanium nitride is formed to protect the device elements adjacent the contact holes from ingress of metal atoms provided in a subsequently deposited metallization layer. In some processes, the contact holes are filled with tungsten plugs according to procedures known in the art. Regardless of whether tungsten plugs are formed, a blanket deposition of a first metallization layer is performed. The first (and all subsequent) metallization layers may be made from various metals or alloys used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various device elements. The exact layout of the lines will be determined by the particular IC or ASIC design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosphosilicate glass is used as the dielectric layer, but other dielectrics such as a nitride or polyimide films (which can be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. After the formation of the vias in the dielectric, the next metallization layer (metal-2) is deposited and patterned as described above. In some cases, it may be necessary to form and pattern one or more additional metallization layers to complete the wiring of the IC.

The current invention has the most potential utility with PMOS devices because the concentration profile of boron is strongly influenced by regions of nitrogen concentration. However, the instant invention also has significant potential for NMOS devices because phosphorus distribution is also affected by areas of significant nitrogen concentration.

The devices of this invention may be characterized by a nitrogen concentration distribution as illustrated in FIGS. 5B and 6B. An important feature of these distributions is the absence of a substantial nitrogen concentration level in the polysilicon gate electrode outside of the interface with the gate electrode. The dual nitrogen peaks at the gate oxide interfaces are important features of gate oxide hardening by nitrogen implantation.

In view of the above devices of this invention may be characterized as having:

(a) nitrogen concentration peaks of at least about $3\times10^{20}$ atoms/cm$^3$ (more preferably about $6\times10^{20}$ atoms/cm$^3$) at the gate oxide interfaces with the silicon substrate and the polysilicon gate electrode and (b) no other regions in the polysilicon gate electrode where the nitrogen concentration exceeds about $1\times10^{20}$ atoms/cm$^3$ (more preferably about $8\times10^{19}$ atoms/cm$^3$).

The devices of this invention may be characterized as having polysilicon gate electrodes which have no nitrogen concentration peaks over about 50% (more preferably about 20%) of the nitrogen concentration peaks at the gate oxide-polysilicon interface. More preferably, the gate electrode has no region of nitrogen concentration that exceeds about $10^{19}$ atoms/cm$^3$ (beyond the gate oxide interface region).

CONCLUSION

While the invention has been described in some detail to facilitate understanding, it will be apparent that certain changes and modifications may be practiced within the scope of the appended claims. For example, while the specification has been limited to a discussion of PMOS devices, there is in principle no reason why the application could not be applied to other semiconductor devices such as NMOS devices to ensure uniform distribution of electronically active dopants in bulk polysilicon. Therefore, the above described embodiments should be considered illustrative and not restrictive and the instant invention is not limited to the details given herein but may be modified within the scope of the appended claims.

What is claimed is:

1. A method for hardening gate oxide in a partially fabricated electronic device, the method comprising:

implanting nitrogen ions in a first polysilicon layer deposited on a gate oxide;

annealing so that nitrogen concentrates on said gate oxide and a location in the bulk of said first polysilicon layer; and removing polysilicon from the top of said first polysilicon layer to provide a second polysilicon layer which does not include said location in the bulk of said first polysilicon layer where nitrogen concentrates.

2. The method of claim 1 wherein said gate oxide is less than about 50 Å thick.

3. The method of claim 1 further comprising the step of implanting an electronically active dopant in said second polysilicon layer.

4. The method of claim 3 wherein said electronically active dopant is boron.

5. The method of claim 3 wherein said electronically active dopant is phosphorus.

6. The method of claim 1 wherein said first polysilicon layer is between about 2000 Å and about 4000 Å thick.

7. The method of claim 6 wherein said second polysilicon layer is between about 750 Å and about 2500 Å thick.

8. The method of claim 1 wherein said annealing is performed between about 800° C. and about 1000° C.

9. The method of claim 8 wherein said annealing is performed at about 900° C.

10. The method of claim 1 wherein said partially fabricated electronic device is a partially fabricated NMOS device.

11. The method of claim 1 wherein said partially fabricated electronic device is a partially fabricated PMOS device.

12. The method of claim 1 further comprising depositing a third polysilicon layer onto said second polysilicon layer to provide a composite polysilicon layer.

13. The method claim 12 wherein said gate oxide is less than about 50 Å thick.

14. The method of claim 12 further comprising the step of implanting an electronically active dopant in said composite polysilicon layer.

15. The method of claim 14 wherein said electronically active dopant is boron.

16. The method of claim 12 wherein said first polysilicon layer is between about 2000 Å and about 4000 Å thick.

17. The method of claim 12 wherein said second polysilicon layer is between about 750 Å and about 2500 Å thick.

18. The method of claim 12 wherein said third polysilicon layer is between about 1000 Å and about 2000 Å thick.

19. The method of claim 12 wherein said composite polysilicon layer is between about 1500 Å and about 3500 Å thick.

20. The method of claim 12 wherein said partially fabricated electronic device is a partially fabricated PMOS device.

* * * * *